(12) United States Patent
Mao et al.

(10) Patent No.: US 11,444,138 B2
(45) Date of Patent: Sep. 13, 2022

(54) DISPLAY PANEL, FABRICATION METHOD THEREFOR, AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Bo Mao, Beijing (CN); Mengyu Luan, Beijing (CN); Changjun Jiang, Beijing (CN); Jun Li, Beijing (CN); Lang Liu, Beijing (CN); Zexu Liu, Beijing (CN); Hongtao Guo, Beijing (CN)

(73) Assignees: Hefei Xinsheng Optoelectronics Technology Co., Ltd., Anhui (CN); Beijing BOE Technology Development Co., Ltd., Beijing (CN)

(*) Notice: Subject to any disclaimer, the term of this patent is extended or adjusted under 35 U.S.C. 154(b) by 0 days.

(21) Appl. No.: 16/648,758

(22) PCT Filed: May 13, 2019

(86) PCT No.: PCT/CN2019/086681
§ 371 (c)(1),
(2) Date: Mar. 19, 2020

(87) PCT Pub. No.: WO2019/218973
PCT Pub. Date: Nov. 21, 2019

(65) Prior Publication Data
US 2020/0258959 A1    Aug. 13, 2020

(30) Foreign Application Priority Data
May 14, 2018    (CN) .......................... 201810454872.3

(51) Int. Cl.
*H01L 27/32*    (2006.01)
*H01L 51/56*    (2006.01)

(52) U.S. Cl.
CPC .......... *H01L 27/3246* (2013.01); *H01L 51/56* (2013.01); *H01L 2227/323* (2013.01)

(58) Field of Classification Search
CPC ................. H01L 27/3246; H01L 51/56; H01L 2227/323
(Continued)

(56) References Cited

U.S. PATENT DOCUMENTS 9,093,669 B2    7/2015    Park et al.
10,483,336 B2    11/2019    Lee et al.
(Continued)

FOREIGN PATENT DOCUMENTS

CN    103794634 A    5/2014
CN    104885251 A    9/2015
(Continued)

OTHER PUBLICATIONS

Apr. 20, 2020—(CN) First Office Action Appn 201810454872.3 with English Translation.

*Primary Examiner* — Dzung Tran
(74) *Attorney, Agent, or Firm* — Banner & Witcoff, Ltd.

(57) ABSTRACT

A display panel, a manufacturing method thereof and a display device are provided. The display panel includes a base substrate, a pixel definition layer, a light emitting layer and a spacer. The pixel definition layer is configured to define each of subpixels in the display panel and includes a groove structure which is disposed between adjacent subpixels, the spacer is disposed in the groove structure, the light emitting layer is disposed on a side of the pixel definition layer and the spacer away from the base substrate, and a thermal expansion efficient of the spacer is greater than a thermal expansion efficient of the light emitting layer.

19 Claims, 7 Drawing Sheets

(58) Field of Classification Search
USPC .......................................................... 257/40
See application file for complete search history.

(56) References Cited

U.S. PATENT DOCUMENTS

| | | | |
|---|---|---|---|
| 10,504,973 | B2 | 12/2019 | Yang |
| 10,672,339 | B2 | 6/2020 | Beak et al. |
| 2003/0189401 | A1* | 10/2003 | Kido .................... C07C 211/58 |
| | | | 313/504 |
| 2006/0017375 | A1* | 1/2006 | Noguchi ............. H01L 27/3279 |
| | | | 313/504 |
| 2013/0299798 | A1* | 11/2013 | Seo ....................... H01L 51/007 |
| | | | 257/40 |
| 2014/0183472 | A1* | 7/2014 | Kim ..................... H01L 27/326 |
| | | | 257/40 |
| 2014/0183479 | A1* | 7/2014 | Park .................... H01L 27/3216 |
| | | | 257/40 |
| 2018/0083223 | A1* | 3/2018 | Saito ................... H01L 51/5237 |
| 2019/0044091 | A1* | 2/2019 | Omata ..................... H01L 51/56 |
| 2019/0058020 | A1* | 2/2019 | Tsai ........................ G06F 3/044 |
| 2020/0258959 | A1 | 8/2020 | Mao et al. |

FOREIGN PATENT DOCUMENTS

| | | | |
|---|---|---|---|
| CN | 106206646 | A | 12/2016 |
| CN | 106876331 | A | 6/2017 |
| CN | 107068721 | A | 8/2017 |
| CN | 108231830 | A | 6/2018 |
| CN | 108649057 | A | 10/2018 |
| KR | 20070089545 | A | 8/2007 |
| KR | 20160094567 | A | 8/2016 |

* cited by examiner

DISPLAY PANEL, FABRICATION METHOD THEREFOR, AND DISPLAY DEVICE

The application is a U.S. National Phase Entry of International Application No. PCT/CN2019/086681 filed on May 13, 2019, designating the United States of America and claiming priority to Chinese Patent Application No. 201810454872.3 filed May 14, 2018. The present application claims priority to and the benefit of the above-identified applications and the above-identified applications are incorporated by reference herein in their entirety.

TECHNICAL FIELD

At least one embodiment of the present disclosure relates to a display panel, a manufacturing method thereof and a display device.

BACKGROUND

With the arrival of the information age, the conventional cathode ray tube (CRT) displays have been replaced by flat panel displays. One of the most widely used flat panel displays is a liquid crystal display (LCD). The LCDs have the characteristics of mature technical development and cheap price. But as the LCDs cannot be self-luminous, there are technical limitations in terms of contrast, viewing angle, flexible display and power consumption. Organic light-emitting diodes (OLEDs) receive much concern due to the characteristics of self-luminescence, wide viewing angle, short response time, high luminous efficiency, wide color gamut, low operating voltage, thin panel, and capability of manufacturing a large-size and flexible display.

SUMMARY

At least one embodiment of the present disclosure provides a display panel, the display panel comprises a base substrate, a pixel definition layer (PDL), a spacer and a light emitting layer. The pixel definition layer is configured to define each of subpixels in the display panel and includes a groove structure which is disposed between adjacent subpixels, the spacer is disposed in the groove structure, the light emitting layer is disposed on a side of the pixel definition layer and the spacer away from the base substrate, and a thermal expansion coefficient of the spacer is greater than a thermal expansion coefficient of the light emitting layer.

For example, in the display panel provided by at least one embodiment of the present disclosure, the light emitting layer is disconnected at the spacer.

For example, in the display panel provided by at least one embodiment of the present disclosure, the spacer is a grid structure; and meshes of the grid structure are in one-to-one correspondence with the subpixels.

For example, in the display panel provided by at least one embodiment of the present disclosure, a length of the spacer is less than or equal to a depth of the groove structure in a direction perpendicular to a plane on which the base substrate is located.

For example, in the display panel provided by at least one embodiment of the present disclosure, the spacer and a side wall of the groove structure are spaced away from each other.

For example, in the display panel provided by at least one embodiment of the present disclosure, the pixel definition layer is disconnected at the groove structure; and a gap is between the spacer and the pixel definition layer.

For example, in the display panel provided by at least one embodiment of the present disclosure, a depth of the groove structure is less than a thickness of the pixel definition layer in a direction perpendicular to a plane on which the base substrate is located; and an end portion of the spacer facing the base substrate is in contact with the pixel definition layer.

For example, in the display panel provided by at least one embodiment of the present disclosure, a cross-sectional area of an end portion of the spacer away from the base substrate in a direction parallel to the plane on which the base substrate is located is greater than a cross-sectional area of an end portion of the spacer facing the base substrate in the direction parallel to the plane on which the base substrate is located.

For example, in the display panel provided by at least one embodiment of the present disclosure, the cross-sectional area of the spacer in the direction parallel to the plane on which the base substrate is located is gradually increased from the end portion of the spacer facing the base substrate to the end portion of the spacer away from the base substrate.

For example, in the display panel provided by at least one embodiment of the present disclosure, the light emitting layer includes a first sub-light emitting layer, a second sub-light emitting layer and a charge generation layer disposed between the first sub-light emitting layer and the second sub-light emitting layer; and the second sub-light emitting layer is disposed on a side of the first sub-light emitting layer away from the base substrate.

For example, in the display panel provided by at least one embodiment of the present disclosure, a thermal expansion coefficient of the spacer is greater than a thermal expansion coefficient of the charge generation layer.

For example, the display panel provided by at least one embodiment of the present disclosure further comprises a first electrode layer and a second electrode layer, the first electrode layer is disposed between the pixel definition layer and the base substrate and includes a plurality of first sub-electrodes spaced from each other, one first sub-electrode of the plurality of first sub-electrodes is disposed in each of the subpixels; and the second electrode layer is disposed on a side of the light emitting layer away from the base substrate.

For example, in the display panel provided by at least one embodiment of the present disclosure, a portion of the pixel definition layer disposed in each of the subpixels is provided with a plurality of openings, and the plurality of openings are configured to expose the plurality of first sub-electrodes.

At least one embodiment of the present disclosure provides a method for manufacturing a display panel, which comprises: providing a base substrate; forming a pattern of a pixel definition layer that defines each of subpixels of the display panel on the base substrate, and forming a groove structure disposed between adjacent subpixels of the subpixels in the pixel definition layer; forming a spacer in the groove structure; and forming a light emitting layer on the pixel definition layer and the spacer; and a thermal expansion coefficient of the spacer is greater than a thermal expansion coefficient of the light emitting layer.

For example, the manufacturing method provided by at least one embodiment of the present disclosure further comprises: heating the display panel obtained after forming the light emitting layer to a set temperature.

For example, in the manufacturing method provided by at least one embodiment of the present disclosure, the set temperature is not less than 40° C.

For example, in the manufacturing method provided by at least one embodiment of the present disclosure, the spacer is made from a thermal expansion material with a thermal expansion coefficient of $50 \times 10^{-5}$ to $100 \times 10^{-5}$ at a temperature of 15° C.-95° C.

For example, in the manufacturing method provided by at least one embodiment of the present disclosure, a material of the spacer includes at least one of polytrifluorochloroethylene or ethylene-trifluoroethylene copolymer; or the material of the spacer includes at least one of resin, polyimide, organic silicon and silicon dioxide doped with polytrifluorochloroethylene.

For example, in the manufacturing method provided by at least one embodiment of the present disclosure, the forming the spacer includes exposure and development, etching or inkjet printing.

At least one embodiment of the present disclosure provides a display device, the display device comprises the display panel according to any above embodiment.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

An OLED display panel may include a base substrate and a plurality of subpixels formed on the base substrate. Each subpixel comprises a transparent anode, a cathode made from metal or alloy, and a light emitting layer composed of a series of organic films and sandwiched between the anode and the cathode. For a large-size OLED display panel, a pixel definition layer is usually used to define a region in which each of the subpixels is located, and a light emitting layer is formed by evaporation. Due to the limitation of the self-weight of a mask, the large-size OLED display panel cannot use a fine metal mask (FMM) to evaporate an organic film. Instead, the organic film needs to be evaporated by surface evaporation. In this way, by forming the organic film using the surface evaporation, adjacent subpixels are communicated with each other, so the lateral leakage phenomenon between adjacent subpixels is prone to occur in the display process.

Figure 1A:
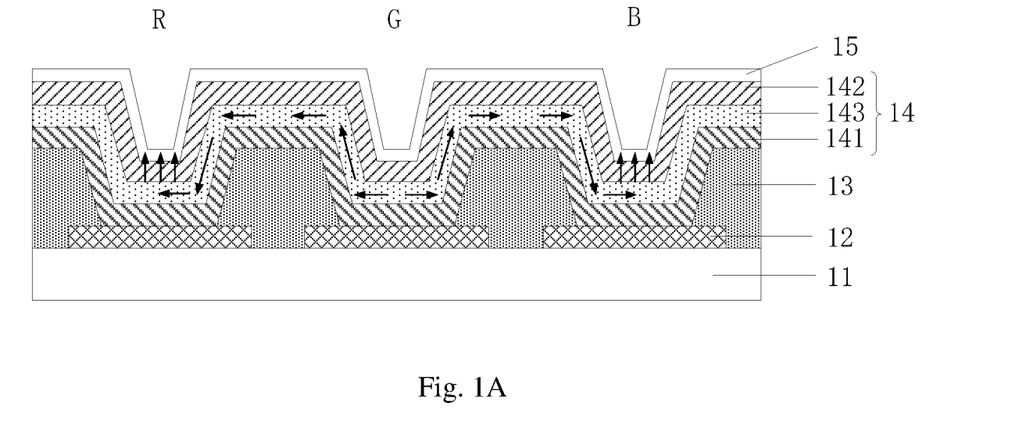
FIG. 1A is a schematic structural view of a display panel.

The main reason that causes lateral leakage phenomenon among the subpixels is a charge generation layer. As shown in FIG. 1A, a light emitting layer 14 of an OLED display panel adopts a laminated structure which includes a first sub-light emitting layer 141, a second sub-light emitting layer 142, and a charge generation layer 143 disposed between the first sub-light emitting layer 141 and the second sub-light emitting layer 142. The charge generation layer 143 is configured to generate electrons and holes which are respectively transmitted to the first sub-light emitting layer 141 and the second sub-light emitting layer 142 in order to emit light due to recombination. However, as the light emitting layers 14 between adjacent subpixels are communicated and the charge generation layer 143 contains active metal ions, the electrons generated by the charge generation layer 143 will be transmitted to adjacent subpixels, so that partial excitons in the adjacent subpixels that should not emit light are subjected to recombination luminescence, resulting in the defect of uneven display.

At least one embodiment of the present disclosure provides a display panel, a manufacturing method thereof and a display device. The display panel comprises a base substrate and a pixel definition layer, a spacer and a light emitting layer disposed on the base substrate. The pixel definition layer is configured to define subpixels in the display panel, namely being used for separating the subpixels in the display panel. Moreover, the pixel definition layer includes a groove structure disposed between adjacent subpixels. The spacer is disposed in the groove structure. The light emitting layer covers the pixel definition layer and the spacer. The spacer includes a thermal expansion material to partition the light emitting layer. For instance, a thermal expansion coefficient of the spacer is greater than a thermal expansion coefficient of the light emitting layer. In this way, by disposing the groove structure on the pixel definition layer and disposing the spacer for separating the light emitting layer in the groove structure and the spacer including the thermal expansion material, in the process of manufacturing the display panel, after the light emitting layer is formed, by using a temperature condition in a process of forming the light emitting layer or heating the display panel to a certain temperature, the spacer is subjected to thermal expansion. as the thermal expansion coefficient of the spacer is greater than the thermal expansion coefficient of the light emitting layer, the expansion of the spacer will result in the breakage of the light emitting layer, so the light emitting layers between the subpixels are not communicated, and then the lateral leakage phenomenon will not occur. Therefore, the display uniformity of the display panel is improved. For instance, an image displayed has an uniform brightness and an improved contrast.

The display panel, the manufacturing method thereof and the display device provided by at least one embodiment of the present disclosure will be described below with reference to the drawings. A thickness and a shape of film layers in the drawings do not reflect the true ratio, and are used to schematically illustrate the technical solutions of the embodiments of the present disclosure.

Figure 2A:
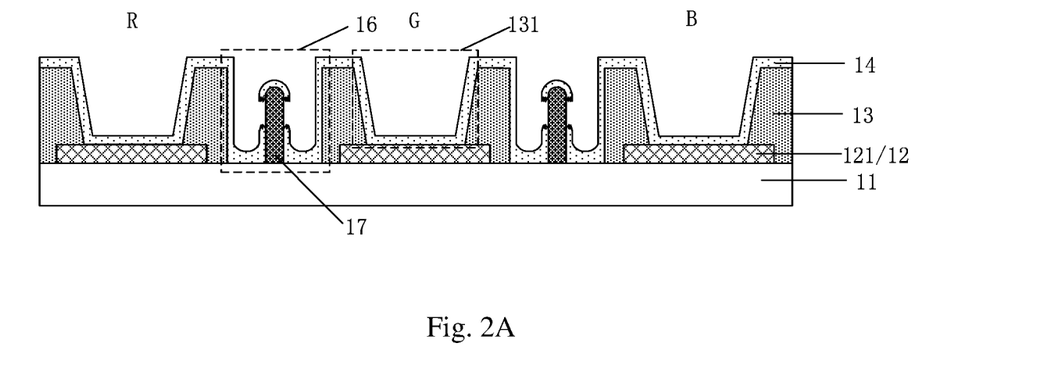
FIG. 2A is a schematic structural view of a display panel provided by some embodiments of the present disclosure.

At least one embodiment of the present disclosure provides a display panel. As shown in FIG. 2A, the display panel comprises a base substrate 11, a pixel definition layer 13 disposed on the base substrate 11, and a light emitting layer 14 disposed on the pixel definition layer 13. The pixel definition layer 13 is configured to separate subpixels (e.g., red subpixels R, green subpixels G and blue subpixels B in the figure) in the display panel, and includes a groove structure 16 disposed between adjacent subpixels. It should be noted that in at least one embodiment of the present disclosure, the color of light emitted by the light emitting layers in the red subpixel R, the green subpixel G and the blue subpixel B may be consistent, for example, all are white light, yellow light, blue light, etc. A color filter layer may be formed on a display side of the display panel after a display element is manufactured or, further, after the display element is packaged. The color filter layer is adopted so that different subpixels emit light of different colors. For instance, the red subpixel R emits red light; the green subpixel G emits green light; and the blue subpixel B emits blue light. The spacer 17 for separating the light emitting layer 14 is disposed in the groove structure 16. The spacer 17 includes a thermal expansion material. for instance, the thermal expansion coefficient of the spacer 17 is greater than the thermal expansion coefficient of the light emitting layer 14.

For instance, the display panel further comprises a first electrode layer 12 disposed on the base substrate 11 and a second electrode layer 15 disposed on the light emitting layer 14. The first electrode layer 12 is disposed between the pixel definition layer 13 and the base substrate 11 and includes a plurality of first sub-electrodes 121 spaced away from each other. The sub-electrodes 121 are in one-to-one correspondence with the subpixels, that is, one sub-electrode 121 is disposed in each subpixel. The second electrode layer 15 is disposed on a side of the light emitting layer 14 away from the base substrate 11. In each subpixel, the first sub-electrode 121, the light emitting layer 14 and the second electrode layer 15 form one light emitting element. For instance, the first electrode layer 12 may be an anode layer, namely the first sub-electrode 121 is an anode of the light emitting element; and the second electrode layer 15 may be a cathode layer, namely a portion of the second electrode layer 15 disposed in one subpixel is taken as a cathode of the light emitting element in the subpixel.

For instance, in the display panel provided by at least one embodiment of the present disclosure, a portion of the pixel definition layer disposed in each subpixel is provided with a plurality of openings, and the opening is configured to expose the first sub-electrode of the first electrode layer. Illustratively, as shown in FIG. 2A, the pixel definition layer 13 is provided with openings 131 corresponding to each subpixel. The opening 131 is overlapped with the first sub-electrode 121, so that the light emitting layers 14 in the opening 131 can be connected with the first sub-electrode 121. It should be noted that in actual process, in view of the requirements such as the process precision, a plane area of the first sub-electrode may be designed to be greater than a plane area of the opening, so as to ensure that the entire light emitting layer 14 formed in the opening 131 (for example, not including a side surface of the opening) may be contact with the first sub-electrode 121, that is, in the same subpixel, an orthographic projection of the opening 131 on a plane on which the base substrate 11 is located falls within an orthographic projection of the first sub-electrode 121 on the plane on which the base substrate 11 is located.

By disposing the groove structure 16 on the pixel definition layer 13, disposing the spacer 17 configured to separate the light emitting layer 14 in the groove structure 16 and the spacer 17 including the thermal expansion material, and the thermal expansion coefficient of the spacer being greater than the thermal expansion coefficient of the light emitting layer 14, in the process of manufacturing the display panel, after the light emitting layer 14 is formed, for instance, the display panel is heated to a certain temperature, so that the spacer 17 is subjected to thermal expansion, and then breakage of the light emitting layer 14 occurs. thus, the light emitting layer 14 between the subpixels is not communicated. Therefore, the lateral leakage phenomenon will not occur, and the display uniformity of the display panel is improved.

For instance, the display panel provided by at least one embodiment of the present disclosure may be applied to a large-size OLED display panel or a white-light display panel. The light emitting layer of the two types of display panels may be usually set to be a laminated structure, that is, the two types of display panels include a charge generation layer. In the current application, the lateral leakage phenomenon is prone to occur in the display panel. For instance, the display panel provided by at least one embodiment of the present disclosure may also be applied in other types of display panels. The application scenes of the display panel provided by at least one embodiment of the present disclosure are not limited here.

Description will be given below to the principles of solving the lateral leakage problem by using the spacer in at least one embodiment of the present disclosure by taking a case that the light emitting layer of the display panel includes the charge generation layer as an example.

FIG. 1A is a schematic structural view of a display panel. In the display panel as shown in FIG. 1A, light emitting layers 14 of subpixels (for example, RGB three subpixels therein) are communicated; the light emitting layer 14 includes a first sub-light emitting layer 141, a second sub-light emitting layer 142, and a charge generation layer 143 disposed between the first sub-light emitting layer and the second sub-light emitting layer; and the charge generation layer 143 is configured to generate electrons and holes. As the charge generation layer 143 contains active metal ions, ions generated by the charge generation layer are prone to be transmitted to adjacent subpixels, resulting in the lateral leakage phenomenon.

Figure 1B:
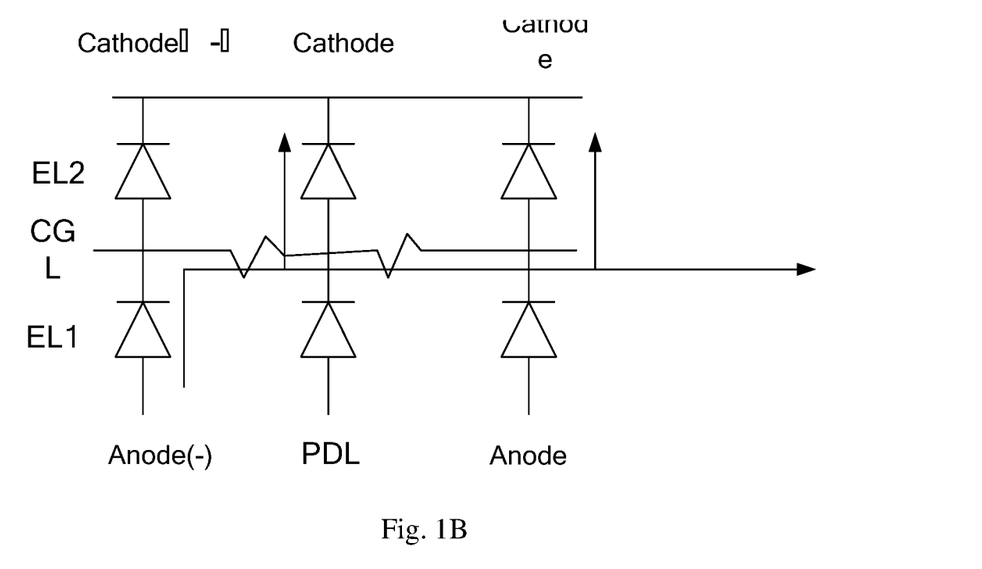
FIG. 1B is an equivalent circuit diagram of the structure as shown in FIG. 1A.

FIG. 1B is an equivalent circuit diagram of two adjacent subpixels in the structure as shown in FIG. 1A. FIG. 1B shows two subpixels and a gap between the two subpixels. An anode is equivalent to a positive electrode, and a cathode is equivalent to a negative electrode. The charge generation layer is equivalent to a wire with impedance. The first sub-light emitting layer EL1 and the second sub-light emitting layer EL2 are respectively equivalent to a diode. Referring to FIGS. 1A and 1B together, when the left subpixel (the subpixel in which a light-emitting diode with the anode "+" and the cathode "−" in the figure is located) is lit, the charge generation layer of the subpixel will leak electrons to the charge generation layer in the adjacent subpixel; and the electrons are transmitted to an upper layer and combined with hole excitons in the light emitting layer 14 of the adjacent subpixel to emit light, as shown by arrows in FIGS. 1A and 1B. In addition, recombination luminescence will also occur at adjacent pixel definition layers 13. As the pixel definition layer 13 has high light absorption coefficient, and a metal wiring (such as a gate line and a data line) is disposed below the pixel definition layer 13 (for example, at a side of the pixel definition layer 13 facing the base substrate 11), light excited by leakage current formed by the above leaked electrons which is transmitted out from the pixel definition layers 13 between the subpixels is relatively less. That is to say, due to the lateral leakage phenomenon between the subpixels, when a certain subpixel is lit, the subpixels at a periphery of the subpixel and the pixel definition layer at the periphery may emit light, so the subpixels that should not emit light emit light, or the luminous brightness of the surrounding subpixels does not conform to the set luminous brightness, or which causes that the gap between the subpixels emits light. Therefore, the display effect of the display panel is affected, which is not conducive to display uniformity.

Figure 2B:
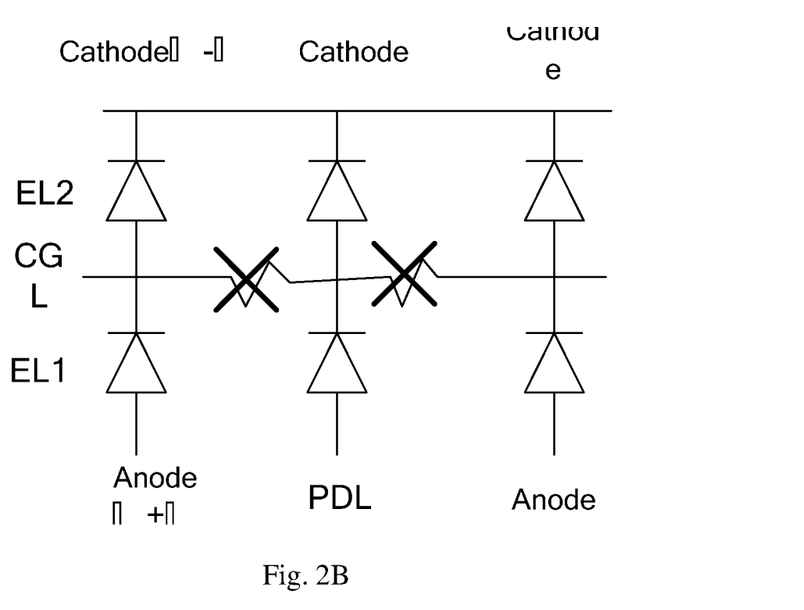
FIG. 2B is an equivalent circuit diagram of the structure as shown in FIG. 2A.

FIG. 2A is a schematic structural view of a display panel provided by some embodiments of the present disclosure. FIG. 2B is an equivalent circuit diagram of two adjacent subpixels in the structure as shown in FIG. 2A. Referring to FIGS. 2A and 2B, in the process of manufacturing the display panel, after an light emitting layer 14 is formed, the display panel may be heated to a set temperature, so that spacer 17 disposed in a groove structure 16 of a pixel definition layer 13 is subjected to thermal expansion, and then the light emitting layer 14 generates a breakage at a gap (a region denoted by a symbol "x" shown in FIG. 2B) between subpixels. Thus, electrons in a charge generation layer of the light emitting layer 14 cannot be transmitted to adjacent subpixels. As shown in FIG. 2B, the electrons in the charge generation layer cannot be transmitted to the right. That is to say, the lateral leakage phenomenon will not occur. Therefore, the display effect of the display panel is improved, and the display uniformity is high.

Figure 2C:
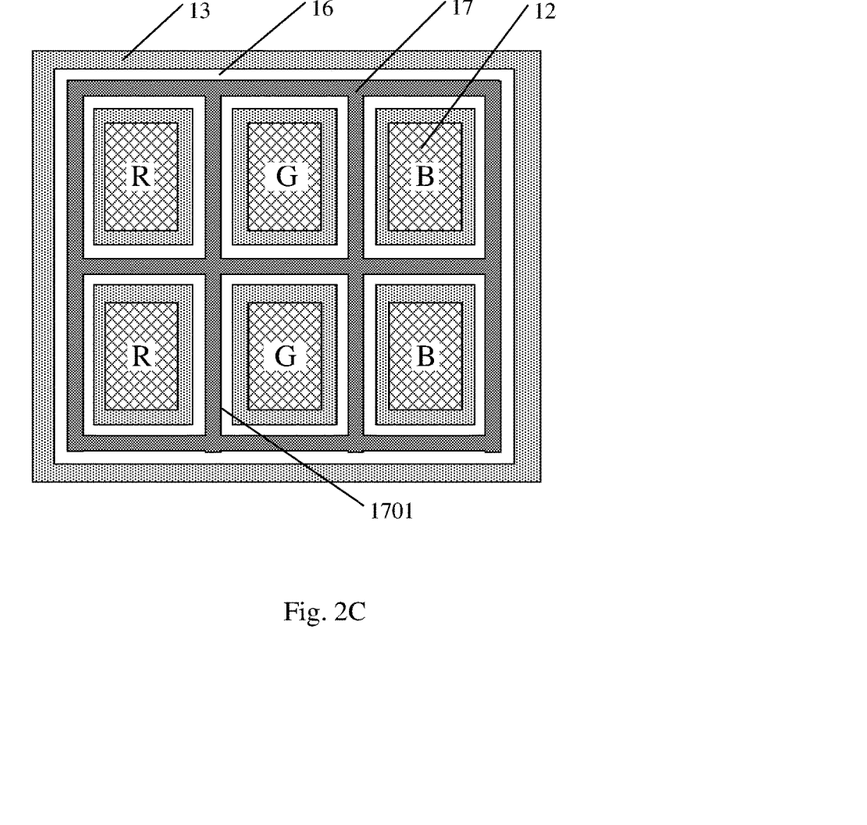
FIG. 2C is a top view of partial structures of a display panel provided by some embodiments of the present disclosure.

For instance, in at least one embodiment of the present disclosure, the groove structure may be set to surround each subpixel, and correspondingly, the spacer may also be set to surround each subpixel. For instance, the spacer may be set to be a grid structure, and meshes of the grid structure are in one-to-one correspondence with the subpixels. In this way, the light emitting layers (or the charge generation layers therein) of adjacent subpixels are disconnected, so as to completely eliminate the lateral leakage phenomenon and further improve the display uniformity of the display panel. Illustratively, as shown in FIG. 2C, both the groove structure 16 and the spacer 17 are set to be a grid structure, and each mesh 1701 of the spacer 17 corresponds to one subpixel (such as R, G or B subpixel).

In at least one embodiment of the present disclosure, under a condition that the thermal expansion coefficient of the spacer is greater than the thermal expansion coefficient of the light emitting layer (or the charge generation layer therein), the material selection of the spacer is not limited. For instance, the spacer includes a thermal expansion material; the thermal expansion material may be directly adopted to manufacture the spacer; or other materials doped with the thermal expansion material may also be adopted to manufacture the spacer. Thermal expansion refers to the phenomenon that a length of an object changes with change of the temperature. The essence of thermal expansion is that the average distance of the crystal lattice structure changes with the change of the temperature. In actual application, the thermal expansion performance of the material is usually expressed by linear expansion coefficient. The linear expansion coefficient refers to the ratio of a length change of a solid object in a certain direction and a length of the solid object at 20° C. (that is, the standard laboratory environment) when the temperature changes by 1° C. For instance, some high molecular polymers also have good linear expansion at relatively low temperature. For example, the linear expansion coefficient of polytrifluorochloroethylene at 20° C.-95° C. is $60 \times 10^{-5}/°$ C. Under a condition that a material with relatively larger linear expansion coefficient at low temperature is selected to manufacture the spacer, when the temperature is raised so that the spacer is expanded to separate the light emitting layer, the set temperature required to be raised may be not required to be too high, so as to avoid adverse effect on elements (such as the light emitting layer) of the display panel.

For instance, in the display panel provided by at least one embodiment of the present disclosure, in a direction perpendicular to a plane on which the base substrate is located, a length of the spacer is less than or equal to a depth of the groove structure. Illustratively, as shown in FIG. 2A, a distance from an end portion of the spacer 17 away from the base substrate 11 to the base substrate 11 is less than a distance from a surface of the pixel definition layer 13 away from the base substrate 11 to the base substrate 11.

As shown in FIG. 2A, the length of the spacer 17 in the direction perpendicular to the base substrate 11, that is, the length of the vertical direction (a direction perpendicular to the plane on which the base substrate 11 is located) in FIG. 2A is less than or equal to the depth of the groove structure 16. Thus, the spacer 17 will not affect the structure of the pixel definition layer 13. For instance, the height of the spacer 17 is a distance from an end portion of the spacer away from the base substrate 11 to another end portion of the spacer facing the base substrate 11. For instance, the height of the spacer may be 0.1 μm-100 μm, e.g., 10 μm, 20 μm, 50 μm or 80 μm. It should be noted that the height of the spacer is not limited to the above value range and may be selected as required. Moreover, under a condition that the height of the spacer does not have adverse effect on the manufacturing process and the display function of the display panel, the height of the spacer may also be set to be greater than the depth of the groove structure.

It should be noted that in actual application, the height of the spacer may be determined according to factors such as the depth of the groove structure and the thermal expansion coefficient of the spacer. For instance, in at least one embodiment of the present disclosure, the height of the spacer may be less than or equal to the depth of the groove structure within the temperature range that the display panel can operate normally (for example, the function of the display panel will not be damaged at this temperature). In the process of manufacturing the display panel, especially in the process of heating the display panel so that the spacer is expanded to separate the light emitting layer, the height of the spacer may also be temporarily greater than the depth of the groove structure. The height of the spacer is not limited here.

For instance, in the display panel provided by at least one embodiment of the present disclosure, the spacer and a side wall of the groove structure are spaced away from each other. In this way, the groove structure cannot be full of the spacer, so the spacer can have enough space to be expanded after heated, and then the light emitting layer on the spacer can be disconnected. More specifically, the spacer 17 may not contact the pixel definition layer 13. As shown in FIG. 2A, in actual application, the spacer 17 may contact the pixel definition layer 13 at one end, as long as the spacer can make the light emitting layer disconnect in the case of thermal expansion.

For instance, in at least one embodiment of the present disclosure, in a direction parallel to the plane on which the base substrate is located, the spacer may be disposed in the middle of the groove structure as shown in FIG. 2A, or may be deviated towards a side wall of the groove structure relative to the middle, or may contact one side wall of the groove structure and be spaced from the other side wall of the groove structure. When the spacer is expanded, as long as the light emitting layer on one side of the spacer is disconnected, the light emitting layers of two adjacent subpixels can be guaranteed to be partitioned. When the spacer is disposed in the middle of the groove structure, the light emitting layers on two opposed side surfaces of the spacer are prone to disconnect. In actual application, the probability of separating the light emitting layers of two subpixels can be improved, and then the product yield can be improved.

Description will be given below to the display panel, the manufacturing method thereof and the display device provided by at least one following embodiment of the present disclosure by taking the case that the spacer is disposed in the middle of the groove structure as an example.

In the embodiment of the present disclosure, the relationship between a depth of the groove structure and a thickness of the pixel definition layer is not limited and may be designed according to the demands of actual process. For instance, in some embodiments of the present disclosure, the groove structure may run through the pixel definition layer. For instance, in some other embodiments of the present disclosure, the groove structure does not run through the pixel definition layer, and the spacer is disposed on the pixel definition layer. Several setting modes of the groove structure will be described below.

For instance, in some embodiments of the present disclosure, as shown in FIG. 2A, the pixel definition layer 13 is disconnected at the groove structure 16, and there are a gap between the spacer 17 and the pixel definition layer 13, that is, the groove structure 16 runs through the pixel definition layer 13. In actual process, an opening 131 is formed in the pixel definition layer 13 to expose the first electrode layer 12, and parts such as a light emitting layer 14 of a light emitting element are formed in the opening 131. The groove structure runs through the pixel definition layer. Thus, in the patterning process of forming the opening 131, the groove structure 16 may be synchronously formed, which will not increase steps of the forming process of the pixel definition layer 13.

Figure 2D:
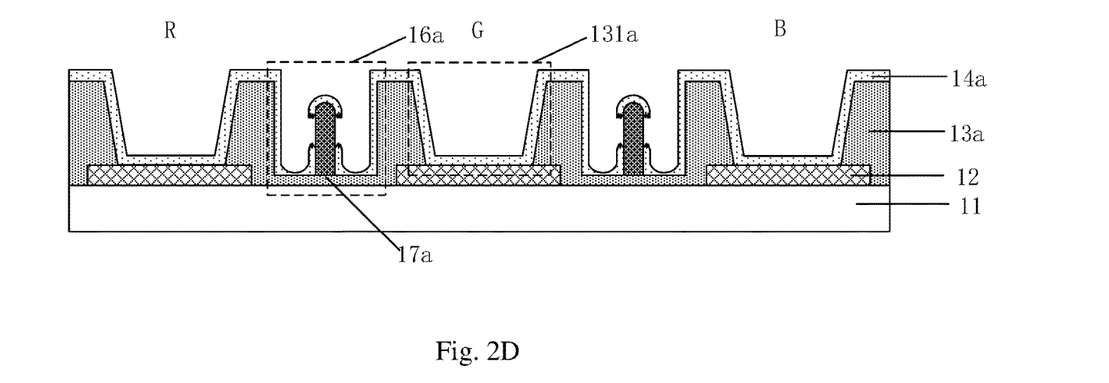
FIG. 2D is a schematic structural view of another display panel provided by some embodiments of the present disclosure.

For instance, in some other embodiments of the present disclosure, as shown in FIG. 2D, in a direction perpendicular to the plane in which the base substrate 11 is located, a depth of a groove structure 16a is less than a thickness of a pixel definition layer 13a, and an end portion of a spacer 17a facing the base substrate 11 makes contact with the pixel definition layer 13a, that is, the groove structure 16a does not run through the pixel definition layer 13a, and the spacer 17a is disposed on the pixel definition layer 13a. Thus, when a design thickness of the pixel definition layer 13a is too large relative to a required height of the spacer 17a, the depth of the groove structure 16a may be designed according to the required height of the spacer 17a, so as to reduce the process difficulty of forming the spacer 17a in the groove structure 16a and reduce the cost. For instance, the groove structure 16a and an opening 131a may be simultaneously formed in one patterning process by utilization of semi-exposure technology (via a half-tone mask). For instance, in the process of patterning the pixel definition layer 13a, the opening 131a is formed at a completely-exposed region of the pixel definition layer 13a, and the groove structure 16a is formed at a semi-exposed region of the pixel definition layer 13a.

Figure 3:
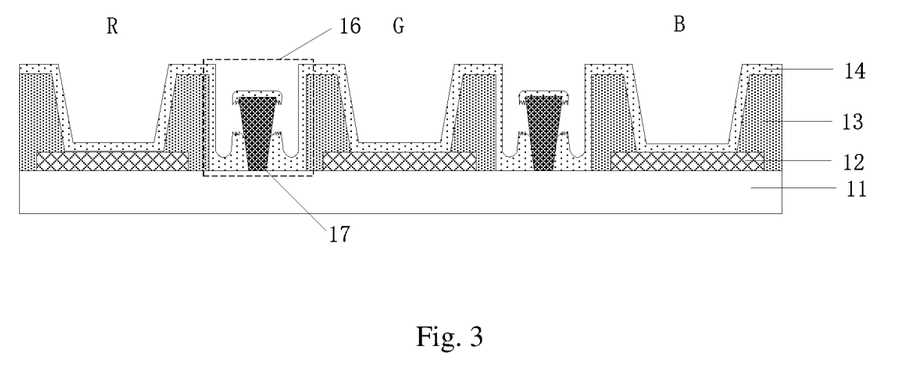
FIG. 3 is a schematic structural view of another display panel provided by some embodiments of the present disclosure.

For instance, in at least one embodiment of the present disclosure, a cross-sectional area of an end portion of the spacer away from the base substrate in the direction parallel to the plane on which the base substrate is located is greater than a cross-sectional area of an end portion of the spacer facing the base substrate in the direction parallel to the plane on which the base substrate is located. Illustratively, as shown in FIG. 3, an area of an end portion (surface) of the spacer 17 away from the base substrate 11 is greater than an area of an end portion (surface) of the spacer 17 facing the base substrate 11. In this way, when the light emitting layer 14 is deposited on the spacer 17, the deposition amount of the light emitting layer 14 on a side surface of the spacer 17 can be reduced. Thus, when the spacer 17 is expanded, it is easy for the light emitting layer 14 on the side surface of the spacer 17 to be disconnected.

For instance, in the display panel provided by at least one embodiment of the present disclosure, a cross-sectional area of the spacer in the direction parallel to the plane on which the base substrate is located is gradually increased from the end portion of the spacer facing the base substrate to the end portion of the spacer away from the base substrate. Illustratively, as shown in FIG. 3, in a direction from the base substrate 11 towards the second electrode layer, the cross-sectional area of the spacer 17 in the direction parallel to the base substrate 11 is gradually increased.

Structures such as the second electrode layer and a package layer disposed on the light emitting layer are not shown in FIG. 3 for more clear illustration of the structure of the spacer. In a direction from the base substrate to the second electrode layer, namely a direction from bottom to up in FIG. 3, the cross-sectional area of the spacer 17 in the direction parallel to the base substrate 11 is gradually increased, that is, a cross section of the spacer 17 in a direction perpendicular to the base substrate 11 is a trapezoid of which an upper portion is relatively wider and a lower portion is relatively narrower. Thus, in the process of forming the light emitting layer 14 on the spacer 17, the light emitting layer 14 is prone to be disconnected at an edge of a side of the spacer 17 away from the base substrate 11, so as to ensure that the light emitting layer 14 is disconnected at the spacer 17. For instance, in the embodiment, a shape of a vertical section of the spacer along the direction perpendicular to the plane on which the base substrate is located is an inverted trapezoid. For instance, the inverted trapezoid may be an isosceles trapezoid as shown in FIG. 3 and may also be a right trapezoid, etc.

It should be noted that under a condition that the cross-sectional area of the spacer in the direction parallel to the plane on which the base substrate is located is gradually increased from the end portion of the spacer facing the base substrate to the end portion of the spacer away from the base substrate, the vertical section shape of the spacer may be designed as required and is not limited to the above inverted trapezoid. For instance, as shown in FIG. 3, an included angle between a side surface of the spacer 17 with the inverted trapezoid shape and the plane on which the base substrate is located is an acute angle, that is, two side surfaces of the spacer 17 are formed as a undercut structure. In actual application, a shape of the spacer may be designed to be that one side surface is formed as an undercut structure. The shape may be an inverse right trapezoid or other shapes.

For instance, in the display panel provided by at least one embodiment of the present disclosure, the light emitting layer may include a first sub-light emitting layer, a second sub-light emitting layer disposed on a side of the first sub-light emitting layer away from the base substrate, and a charge generation layer disposed between the first sub-light emitting layer and the second sub-light emitting layer. For instance, in a large-size OLED display panel or a white-light OLED display panel, the light emitting layer may be a laminated structure, so as to reduce the process difficulty of forming the light emitting layer and simultaneously achieve higher resolution. In addition, the light emitting layer may also include a hole injection layer (HIL), a hole transport layer (HTL), an electron transport layer (ETL), an electron injection layer (EIL) and the like, and may also include film layers such as a hole blocking layer (HBL) and an electron blocking layer (EBL) according to actual demands. It should be noted that in at least one embodiment of the present disclosure, other layers in the light emitting layer except the charge generation layer or except the first sub-light emitting layer, the second sub-light emitting layer and the charge generation layer are not limited to be formed by evaporation. Other film layers such as the HIL, the HIL, the ETL, the EIL, the HBL and the EBL may also be formed by, for example, inkjet printing and the like.

For instance, in a light emitting element, an anode layer, a hole injection layer, a hole transport layer, a light emitting layer, an electron transport layer, an electron injection layer and a cathode layer are superimposed to each other in sequence. For instance, the electron blocking layer may be disposed between the anode layer and the light emitting layer, and the hole blocking layer may be disposed between the cathode layer and the light emitting layer, but not limited thereto. For instance, the hole blocking layer or the electron blocking layer may be made from an organic material.

For instance, the hole injection layer may use triphenylamine compounds or a P-doped organic layer or a polymer, such as tri-[4-(5-phenyl-2-thienyl) benzene]amine, 4,4', 4"-tri[2-naphthyl (phenyl) amino] triphenylamine (2-TNATA) or 4,4', 4"-tri-(3-methylphenylaniline) triphenylamine (m-MTDATA), copper phthalocyanine (CuPc), Pedot:Pss, TPD or F4TCNQ.

The hole transport layer may be use aromatic diamine compounds, triphenylamine compounds, aromatic triamine compounds, biphenyldiamine derivatives, triarylamine polymers and carbazole polymers, such as NPB, TPD, TCTA and polyvinyl carbazole or a monomer thereof.

For instance, the electron transport layer may use phenanthroline monohydrate derivatives, oxazole derivatives, thiazole derivatives, imidazole derivatives, metal complexes and anthracene derivatives, more specifically, including: 8-hydroxyquinoline aluminum salt (Alq3), 8-hydroxyquinolinolato-lithium (Liq), 8-hydroxyquinoline gallium salt, bis[2-(2-hydroxyphenyl-1)-pyridine] beryllium, 2-(4-diphenyl)-5-(4-tert-butylphenyl)-1,3,4-oxadiazole (PBD), 1,3,5-tris (N-phenyl-2-benzimidazole-2) benzene (TPBI), BCP, Bphen, etc.

For instance, the electron injection layer may use alkali metal oxides, alkali metal fluorides, etc. The alkali metal oxides include lithium oxide ($Li_2O$), lithium boron oxide (LiBO), potassium silicon oxide ($K_2SiO_3$), cesium carbonate ($Cs_2CO_3$), etc. The alkali metal fluorides include lithium fluoride (LiF), sodium fluoride (NaF), etc.

For instance, in at least one embodiment of the present disclosure, the light emitting layer (e.g., the first sub-light emitting layer and the second sub-light emitting layer therein) may be an organic light emitting layer, and an organic light emitting material of the light emitting layer may include fluorescent light emitting material or phosphorescent light emitting material. For instance, the organic light emitting layer may adopt a doping system, namely a host light emitting material may be mixed with a doped material to obtain an available light emitting material. For instance, the host luminescent material may adopt metal complex materials, anthracene derivatives, aromatic diamine compounds, triphenylamine compounds, aromatic triamine compounds, biphenyldiamine derivatives, triarylamine polymers or the like, for example, bis (2-methyl-8-hydroxyquinoline-N1, O8)-(1,1'-biphenyl-4-hydroxy) aluminum (Balq), 9,10-bis-(2-naphthyl) anthracene (ADN), TAZ, 4,4'-bis (9-carbazole) biphenyl (CBP), MCP, 4,4', 4"-tri-9-carbazolyltriphenylamine (TCTA), N, N-bis (α-naphthyl-phenyl)-4,4-biphenyldiamine (NPB), etc. The fluorescent light emitting material or the doping material, for example, include coumarin dyes (coumarin 6, C-545T), quinacridone (DMQA), 4-(dicyanomethylene)-2-methyl-6-(4-dimethylamino-styrene)-4H-pyran (DCM) series, etc. The light emitting phosphorescent material or the doping material, for example, include metal complex luminescent materials based on Ir, Pt, Ru, Cu or the like, for example, FIrpic, Fir6, FirN4, Flrtaz, Ir(ppy)3, Ir(ppy)2(acac), PtOEP, (btp)2Iracac, Ir(piq)2(acac), (MDQ)2Iracac, etc. In addition, the light emitting material may also include doped double-host.

For instance, a material of the charge generation layer may include organic-inorganic hybrid perovskite materials. For example, a structural formula of the material is $ABX_3$, in which A is an organic ammonium group; B is a fourth main group metal ion or a transition metal ion; and X is a halogen element or a combination of multiple halogen elements. For instance, A may be any one of alkylamine, aromatic amine and diamine; B may be any one of fourth main group metal ions $Pb^{2+}$, $Ge^{2+}$ and $Sn^{2+}$ and may also be any one of transition metal ions $Cu^{2+}$, $Ni^{2+}$, $Co^{2+}$, $Fe^{2+}$, $Mn^{2+}$ and $Eu^{2+}$; and X may be one or a combination of halogen elements Cl, Br and I.

At least one embodiment of the present disclosure provides a method for manufacturing a display panel. The manufacturing method comprises: providing a base substrate; forming a pattern of a pixel definition layer for defining subpixels of the display panel on the base substrate, and forming a groove structure disposed between adjacent subpixels in the pixel definition layer; forming a spacer in the groove structure; and forming a light emitting layer on the pixel definition layer and the spacer, wherein a thermal expansion coefficient of the spacer is greater than a thermal expansion coefficient of the light emitting layer. As the principle of solving a problem of the manufacturing method are similar to those in the above display panel, the implementation of the manufacturing process and a structure of the display panel obtained by the manufacturing process may refer to relevant description in the above embodiments, and will not be further described in detail.

Figure 4:
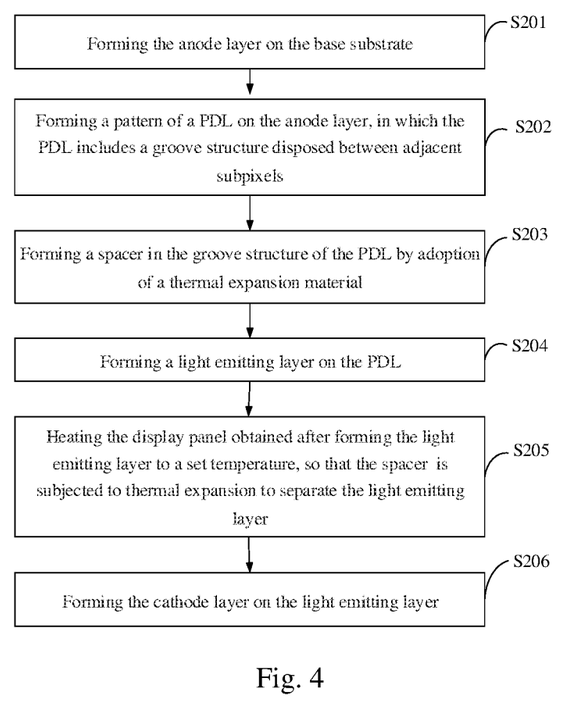
FIG. 4 is a flowchart illustrating a method for manufacturing a display panel provided by some embodiments of the present disclosure.

The manufacturing method of the display panel provided by the embodiment of the present disclosure, as shown in FIG. 4, may comprise the following processes. The process includes forming a first electrode layer and a second electrode layer. The first electrode layer is an anode layer, and the second electrode layer is a cathode layer.

S201: forming the anode layer on the base substrate.

Figure 5A:
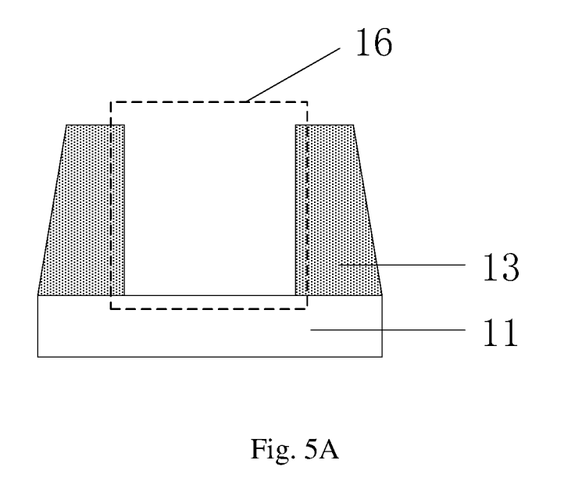
FIGS. 5A to 5F are schematic structural views illustrating the manufacturing process of the display panel provided by some embodiments of the present disclosure.

S202: forming a pattern of a pixel definition layer 13 on the anode layer, in which the pixel definition layer 13 includes a groove structure 16 disposed between adjacent subpixels, as shown in FIG. 5A.

Figure 5B:
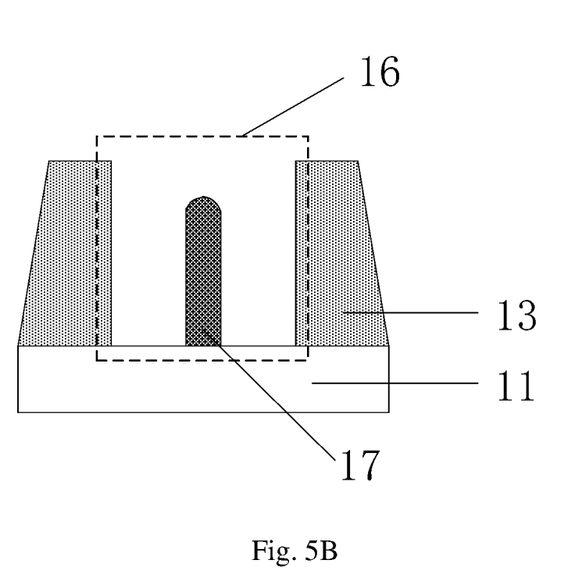

S203: forming a spacer 17 in the groove structure 16 of the pixel definition layer 13 by adoption of a thermal expansion material, as shown in FIG. 5B.

Figure 5C:
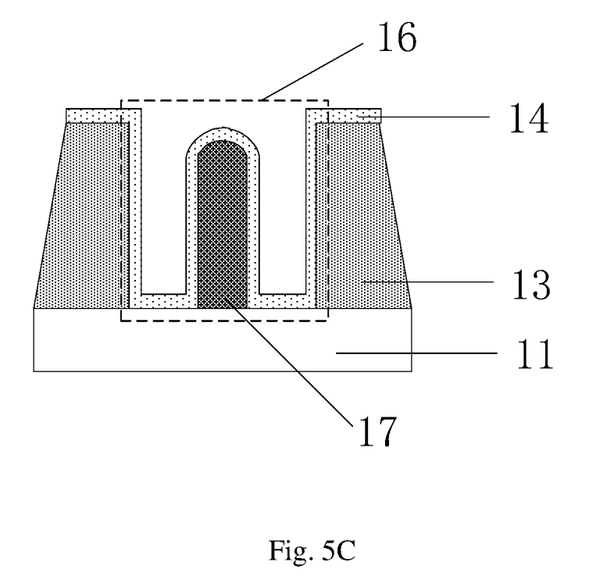
Figure 5D:
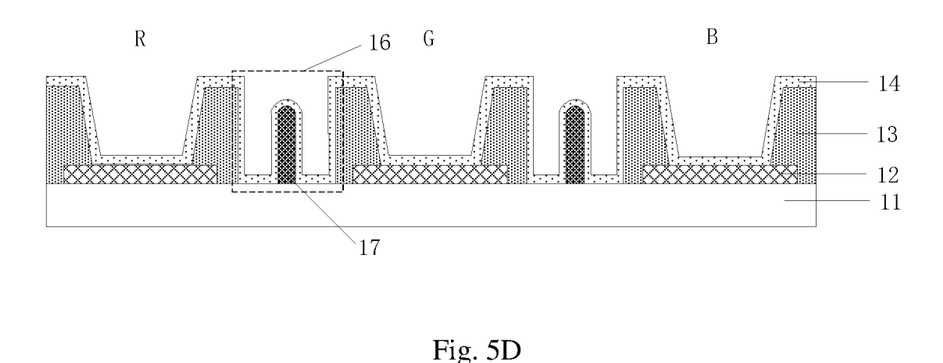

S204: forming a light emitting layer 14 on the pixel definition layer 13, as shown in FIGS. 5C and 5D.

Figure 5E:
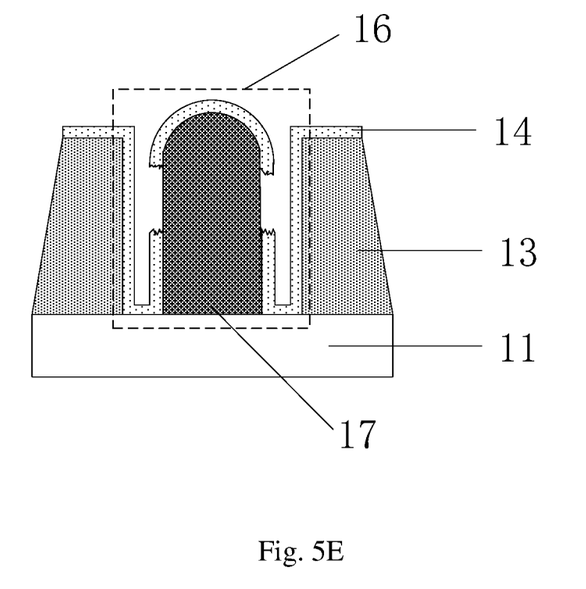

S205: heating a display panel obtained after forming the light emitting layer to a set temperature, so that the spacer 17 is subjected to thermal expansion to separate the light emitting layer 14, as shown in FIG. 5E.

S206: forming the cathode layer on the light emitting layer.

In the manufacturing method of the display panel provided by at least one embodiment of the present disclosure, by forming the groove structure between adjacent subpixels on the pixel definition layer, and by forming the spacer in the groove structures by adoption of the thermal expansion material; and subsequently, after the light emitting layer is formed, the display panel is heated to the set temperature, so that the spacer is subjected to thermal expansion to separate the light emitting layer. thus, the light emitting layers between the subpixels are not communicated, so the lateral leakage phenomenon will not occur, and then the display uniformity of the display panel is improved.

For instance, before the above step S201, a drive circuit layer may also be formed on the base substrate. The drive circuit layer includes a plurality of thin-film transistors (TFTs) and a plurality of signal lines such as gate lines and data lines. For instance, the forming the drive circuit layer may include: forming a gate layer, an active layer, an etch-stop layer (ESL), a passivation layer (PVX), a planarization layer (Resin), etc. In the forming process, the drive circuit layer with a thickness of about 1 μm-100 μm is formed by repeating the processes such as film forming, exposure, development and etching and the like. Wherein, the film forming process is implemented by a method such as sputtering, plasma enhanced chemical vapor deposition (PECVD), evaporation, spin coating, blade coating, printing, inkjet printing or the like.

In the embodiment of the present disclosure, the materials of the first electrode layer and the second electrode layer may be selected according to the light emitting mode of the display panel (a light emitting element therein). For instance, in some embodiments of the present disclosure, the light emitting mode of the display panel is top-emission; the second electrode layer is a transparent electrode layer or semi-transparent electrode layer; the first electrode layer may be a reflecting electrode layer; or the first electrode layer may be set to be a transparent electrode layer, and a reflecting layer is disposed between the first electrode layer and the base substrate to reflect light. For instance, in some other embodiments of the present disclosure, the light emitting mode of the display panel is bottom-emission; the second electrode layer may be set to be a reflecting electrode layer; and the first electrode layer may be set to be a transparent electrode layer or a semi-transparent electrode layer.

For instance, in at least one embodiment of the present disclosure, the first electrode layer is an anode layer of the light emitting element and the second electrode layer is a cathode layer of the light emitting element. The anode layer is acted as a connecting layer of the forward voltage of the light emitting element and has good conductivity and high work function value. For instance, the anode layer may be made from a conductive material with high work function, and an electrode material of the anode layer may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotube, etc. The cathode layer is taken as a connecting layer of the negative voltage of the light emitting element and has good conductivity and low work function value. The cathode layer may be made from a metallic material with low work function value such as lithium, magnesium, calcium, strontium, aluminum or indium, or made from the above metallic materials with low work function value and alloy of copper, gold and silver. In addition, for the cathode layer made from the above metallic materials, when the cathode layer is required to be set to be light-transmitting, a thickness of the cathode layer need to be designed to be able to transmit light.

For instance, in at least one embodiment of the present disclosure, when the first electrode layer (the anode layer) of the light emitting element is set to be a reflecting electrode, the anode layer may be designed to be a laminated layer composed of a plurality of film layers; a portion of the film layers may be made from a transparent conductive material (such as ITO, IZO or the like); and another portion of the film layers may be a non-transparent conductive material (such as chrome, silver, or the other metal). For instance, the laminated layer may be an ITO/Ag/ITO laminated layer, and Ag refers to silver.

For instance, in at least one embodiment of the present disclosure, the above "transparent" may indicate that the light transmittance is 75%-100%, and the above "semi-transparent" may indicate that the light transmittance is 25%-75%.

For instance, in the above step S201, the first electrode layer may be made from a transparent conductive material, such as a ITO material. The first electrode layer may generally include a block structure, namely a first sub-electrode, corresponding to each of the subpixels. As shown in FIG. 5A, in the above step S202, the pattern of the pixel definition layer is formed on the first electrode layer. For instance, the pixel definition layer is formed on the first electrode layer by spin-coating or slit-coating using a material such as resin, polyimide, organic silicon, silicon dioxide ($SiO2$), photoresist or the like. A thickness of the pixel definition layer may be 0.1 μm-100 μm, e.g., 1 μm-5 μm. Subsequently, the pixel definition layer is patterned by processes such as exposure, development and drying to form subpixel regions and a groove structure.

For instance, in the manufacturing process of the display panel provided by at least one embodiment of the present disclosure, the above step S203 may include: forming the spacer in the groove structure of the pixel definition layer by adoption of a thermal expansion material with the thermal expansion coefficient of $50 \times 10^{-5}$ to $100 \times 10^{-5}$ at 15° C.-95° C.

For instance, in specific implementation, a thermal expansion material may be directly adopted to manufacture the spacer, or a thermal expansion material may be doped into a polymer material to manufacture the spacer. Taking the case that a doping proportion of the thermal expansion material is 60% as an example, under a condition that the linear expansion coefficient of the thermal expansion materials is $60 \times 10^{-5}$, a height of the spacer is about 5 μm, a temperature difference is 60° C., the linear expansion amount of the spacer produced by thermal expansion is $\Delta L = 5 \times 100$ Å $\times 60 \times 60 \times 10^{-5} \times 60\% = 1080$ Å, and a thickness of the light emitting layer disposed on the spacer is usually about 3,300 Å. As the light emitting layer is usually made from a fragile material, the light emitting layer can be disconnected as long as the linear expansion amount can reach 100 Å. Therefore, in at least one embodiment of the present disclosure, the light emitting layer can be disconnected when the spacer is made from the above thermal expansion material with the thermal expansion coefficient of $50 \times 10^{-5}$ to $100 \times 10^{-5}$. More specifically, a height of the spacer may be 0.1 μm-100 μm.

For instance, in the manufacturing method of the display panel provided by at least one embodiment of the present disclosure, in the above step S203, the spacer may be manufactured at least by the following two manners:

First manner: directly adopting a thermal expansion material to manufacture the spacer. The thermal expansion material is usually an organic high molecular polymer. For instance, a fluoropolymer such as polytrifluorochloroethylene and/or an ethylene-trifluoroethylene copolymer material may be adopted to form the spacer in the groove structure of the pixel definition layer.

Second means: doping a thermal expansion material into an other material. For instance, the thermal expansion material may be doped into a materials for preparing the pixel definition layer or the planarization layer. For example, at least one of resin, polyimide, organic silicon and silicon dioxide doped with polytrifluorochloroethylene, may be adopted to form the spacer in the groove structure of the pixel definition layer.

It should be noted that the first manner and the second manner are a portion of examples of materials for forming the spacer in the embodiment of the present disclosure; and in specific implementation, other materials may also be adopted to form the spacer. The material of the spacer is not limited here.

For instance, in actual application, in the above manufacturing method provided by at least one embodiment of the present disclosure, the above step S203 may include: forming the spacer in the groove structure of the pixel definition layer by adoption of a thermal expansion material via exposure, development, etching or inkjet printing.

In actual technological process, specific process method need to be selected according to the material of the spacer. The manner in which exposure, development, etching or inkjet printing is used is only a portion of examples of the process method for forming the spacer in the embodiment of the present disclosure. The manufacturing process of the spacer is not limited here.

For instance, referring to FIGS. 5C and 5D, film layers in the light emitting layer 14 are evaporated on the pixel definition layer via an open mask, and a structure of the display panel obtained after evaporation is as shown in FIG. 5D. In the process of evaporating the light emitting layer 14, due to the deposition of an evaporation material, there will be a certain increase in the temperature of the display panel. For instance, the temperature of the display panel may be raised to about 40° C., so the spacer 17 will be expanded to a certain degree. The process may be as shown in FIGS. 5C and 5B. A volume of the spacer in FIG. 5C is greater than a volume of the spacer in FIG. 5B.

For instance, in the above step S205, after evaporating the film layers in the light emitting layer, after the light emitting layer in all the subpixels on the display panel are evaporated, the display panel may be heated to the set temperature, for example, heated to 80° C., so that the spacer 17 is subjected to thermal expansion, and then breakage of the light emitting layer 14 occurs, as shown in FIG. 5E. The specific heating temperature may be determined according to factors such as the thermal expansion coefficient of the spacer and the heat resistance of the display panel. The set temperature is not limited to the above 80° C. The specific value of the set temperature is not limited in the embodiment of the present disclosure.

Figure 5F:
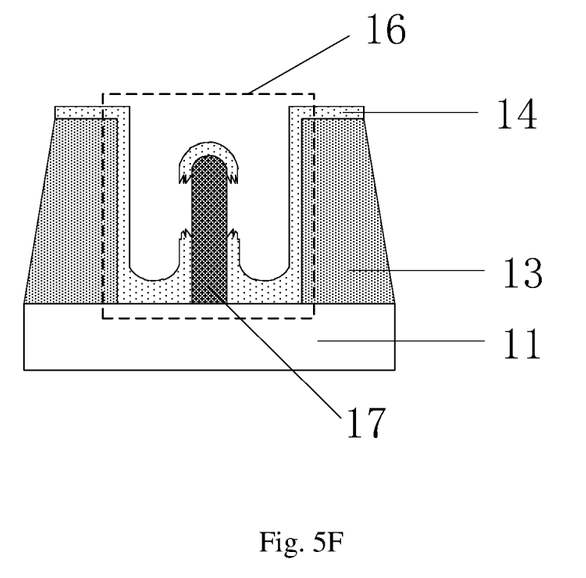

For instance, as shown in FIG. 5F, after the display panel is cooled to the room temperature, the spacer 17 is reduced to a size at the time of production due to temperature reduction, namely being similar to a size of the spacer obtained in the step S203, but the disconnected light emitting layer cannot be restored, that is, the light emitting layer is still in the disconnected state. a material of organic film layers of the disconnected light emitting layer is deposited in the groove structure and will not affect the performances of the display panel. For instance, after the above processes are completed, the second electrode layer is formed on the light emitting layer.

At least one embodiment of the present disclosure provides a display device, which comprises the display panel provided by any foregoing embodiment. For instance, in the display device provided by at least one embodiment of the present disclosure, a touch substrate may be disposed on a display side of the display panel so that the display device has touch display function.

For instance, in the display device provided by at least one embodiment of the present disclosure, a polarizing layer may be disposed on the display side of the display panel. The polarizing layer may include structures such as a polarizer and a retarder (e.g., ¼ wave plate). Thus, light incident into the display panel from the outside will not be emitted from the display panel, so as to eliminate the adverse effect of ambient light on a displayed image of the display device and improve the display effect of the display device.

For instance, in the display device provided by at least one embodiment of the present disclosure, a color filter layer may be disposed on the display side of the display panel. The color filter layer allows the display device to display a color image when the subpixels of the display panel emit light of one color, and can absorb light from external environment so as to reduce the adverse effect of ambient light on the displayed image of the display device and improve the display effect of the display device. For instance, in the display device provided by at least one embodiment of the present disclosure, a light-splitting element (such as a light-spitting optical grating) may be disposed on the display side of the display device, so that the display device may have a three-dimensional display function.

For instance, the display device may be applied to any product or component with display function such as a mobile phone, a tablet, a TV, a display, a notebook computer, a digital album or a navigator. As the principle of solving a problem of the display device is similar to that in the above display panel, the implementation of the display device may refer to the implementation of the above display panel and will not be further described.

In the display panel, the manufacturing method thereof and the display device provided by at least one embodiment of the present disclosure, the groove structure is disposed on the pixel definition layer; the spacer for separating the light emitting layer is disposed in the groove structure; and the spacer includes a thermal expansion material. In the process of manufacturing the display panel, after the light emitting layer is formed, the display panel is heated to a certain temperature, so that the spacer is subjected to thermal expansion, and then breakage of the light emitting layer occurs. Therefore, the light emitting layers between the subpixels are not communicated with each other, so the lateral leakage phenomenon will not occur, and then the display uniformity of the display panel is improved.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or a region may be enlarged or reduced, that is, the accompanying drawings are not drawn according to the actual scale.

(3) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims.

The invention claimed is:

1. A display panel, comprising:
a base substrate;
a pixel definition layer, configured to define subpixels in the display panel and including a groove structure which is disposed between adjacent subpixels;
a spacer, disposed in the groove structure; and
a light emitting layer, disposed on a side of the pixel definition layer and the spacer away from the base substrate,
wherein a thermal expansion coefficient of the spacer is greater than a thermal expansion coefficient of the light emitting layer,
wherein the spacer and a side wall of the groove structure are spaced away from each other, a gap is between the spacer and the pixel definition layer, and a portion of the light emitting layer is disposed at a bottom of the gap between the spacer and the pixel definition layer which is closer to the base substrate.

2. The display panel according to claim 1, wherein the light emitting layer is disconnected at the spacer.

3. The display panel according to claim 1, wherein the spacer is a grid structure; and meshes of the grid structure are in a one-to-one correspondence with the sub pixels.

4. The display panel according to claim 1, wherein a length of the spacer is less than or equal to a depth of the groove structure in a direction perpendicular to a plane on which the base substrate is located.

5. The display panel according to claim 1, wherein the pixel definition layer is disconnected at the groove structure.

6. The display panel according to claim 1, wherein
a depth of the groove structure is less than a thickness of the pixel definition layer in a direction perpendicular to a plane on which the base substrate is located; and
an end portion of the spacer facing the base substrate is in contact with the pixel definition layer.

7. The display panel according to claim 1, wherein a cross-sectional area of an end portion of the spacer away from the base substrate in a direction parallel to a plane on which the base substrate is located is greater than a cross-sectional area of an end portion of the spacer facing the base substrate in the direction parallel to the plane on which the base substrate is located.

8. The display panel according to claim 7, wherein the cross-sectional area of the spacer in the direction parallel to the plane on which the base substrate is located is gradually increased from the end portion of the spacer facing the base substrate to the end portion of the spacer away from the base substrate.

9. The display panel according to claim 1, wherein
the light emitting layer includes a first sub-light emitting layer, a second sub-light emitting layer, and a charge generation layer disposed between the first sub-light emitting layer and the second sub-light emitting layer; and
the second sub-light emitting layer is disposed on a side of the first sub-light emitting layer away from the base substrate.

10. The display panel according to claim 9, wherein the thermal expansion coefficient of the spacer is greater than a thermal expansion coefficient of the charge generation layer.

11. The display panel according to claim 1, further comprising:
a first electrode layer, disposed between the pixel definition layer and the base substrate and including a plurality of first sub-electrodes spaced from each other, in which one first sub-electrode of the plurality of first sub-electrodes is disposed in each of the subpixels; and
a second electrode layer, disposed on a side of the light emitting layer away from the base substrate.

12. The display panel according to claim 11, wherein a portion of the pixel definition layer disposed in the subpixels is provided with a plurality of openings, and the plurality of openings are configured to expose the plurality of first sub-electrodes.

13. A method for manufacturing a display panel, comprising:
providing a base substrate;
forming a pattern of a pixel definition layer that defines subpixels of the display panel on the base substrate, and forming a groove structure disposed between adjacent subpixels of the subpixels in the pixel definition layer;
forming a spacer in the groove structure; and
forming a light emitting layer on the pixel definition layer and the spacer,
wherein a thermal expansion coefficient of the spacer is greater than a thermal expansion coefficient of the light emitting layer,
wherein the spacer and a side wall of the groove structure are spaced away from each other, a gap is between the spacer and the pixel definition layer, and a portion of the light emitting layer is disposed at a bottom of the gap between the spacer and the pixel definition layer which is closer to the base substrate.

14. The method for manufacturing the display panel according to claim 13, further comprising:

heating the display panel obtained after forming the light emitting layer to a set temperature.

15. The method for manufacturing the display panel according to claim 14, wherein the set temperature is not less than 40° C.

16. The method for manufacturing the display panel according to claim 13, wherein the spacer is made from a thermal expansion material with a thermal expansion coefficient of $50 \times 10^{-5}$ to $100 \times 10^{-5}$ at a temperature of 15° C.-95° C.

17. The method for manufacturing the display panel according to claim 13, wherein a material of the spacer includes at least one of polytrifluorochloroethylene or an ethylene-trifluoroethylene copolymer; or the material of the spacer includes at least one of resin, polyimide, organic silicon, and silicon dioxide, doped with polytrifluorochloroethylene.

18. The method for manufacturing the display panel according to claim 13, wherein the forming the spacer includes exposure and development, etching or inkjet printing.

19. A display device, comprising a display panel, wherein the display panel comprises:

a base substrate;

a pixel definition layer, configured to define subpixels in the display panel and including a groove structure which is disposed between adjacent subpixels;

a spacer, disposed in the groove structure; and a light emitting layer, disposed on a side of the pixel definition layer and the spacer away from the base substrate, wherein a thermal expansion coefficient of the spacer is greater than a thermal expansion coefficient of the light emitting layer, wherein the spacer and a side wall of the groove structure are spaced away from each other, a gap is between the spacer and the pixel definition layer, and a portion of the light emitting layer is disposed at a bottom of the gap between the spacer and the pixel definition layer which is closer to the base substrate.

* * * * *